United States Patent
Liu et al.

(10) Patent No.: US 9,524,967 B1
(45) Date of Patent: Dec. 20, 2016

(54) SEMICONDUCTOR DEVICE AND METHOD OF FORMING THE SAME

(71) Applicant: UNITED MICROELECTRONICS CORP., Hsin-Chu (TW)

(72) Inventors: Hao-Yeh Liu, Kaohsiung (TW); Chien-Ming Lai, Tainan (TW); Yu-Ping Wang, Taoyuan (TW); Mon-Sen Lin, Ping-Tung County (TW); Ya-Huei Tsai, Tainan (TW); Ching-Hsiang Chiu, Yilan County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/046,458

(22) Filed: Feb. 18, 2016

(30) Foreign Application Priority Data

Jan. 12, 2016 (TW) .............................. 105100737 A

(51) Int. Cl.
  *H01L 27/088* (2006.01)
  *H01L 27/092* (2006.01)
  *H01L 21/8234* (2006.01)

(52) U.S. Cl.
  CPC ..... *H01L 27/088* (2013.01); *H01L 21/823462* (2013.01); *H01L 27/092* (2013.01)

(58) Field of Classification Search
  CPC ........... H01L 27/088; H01L 21/823462; H01L 27/092
  See application file for complete search history.

(56) References Cited

U.S. PATENT DOCUMENTS

| 7,037,830 | B1 | 5/2006 | Rumer et al. |
| 9,177,865 | B2* | 11/2015 | Kim ................. H01L 21/82345 |
| 2015/0021698 | A1* | 1/2015 | Ando ............. H01L 21/823807 257/368 |

OTHER PUBLICATIONS

Yang, Title of Invention: Semiconductor Device and Method for Fabricating the Same, U.S. Appl. No. 14/557,387, filed Dec. 1, 2014.

* cited by examiner

*Primary Examiner* — Karen Kusumakar
(74) *Attorney, Agent, or Firm* — Winston Hsu; Scott Margo

(57) ABSTRACT

A semiconductor device and a method of forming the same, the semiconductor device include a substrate, and a first transistor, a second transistor and a third transistor all disposed on the substrate. The first transistor includes a first channel, and a first barrier layer and a first work function layer stacked with each other on the first channel. The second transistor includes a second channel, and a second barrier layer and a second work function layer stacked with each other. The third transistor includes a third channel and a third barrier layer and a third work function layer stacked with each other on the third channel, wherein the first barrier layer, the second barrier layer and the third barrier layer have different nitrogen ratio. The first, the second and the third transistors have different threshold voltages, respectively.

18 Claims, 6 Drawing Sheets

SEMICONDUCTOR DEVICE AND METHOD OF FORMING THE SAME

BACKGROUND OF THE INVENTION

1. Field of the Invention

The invention relates to a semiconductor device having transistors and a method of forming the same, and more specifically to a semiconductor device having transistors with different threshold voltages ($V_{th}$) and a method of forming the same.

2. Description of the Prior Art

Poly-silicon is conventionally used as a gate electrode in semiconductor devices, such as the metal-oxide-semiconductor (MOS). With the trend towards scaling down the size of semiconductor devices, however, conventional poly-silicon gates face problems such as inferior performance due to boron penetration and unavoidable depletion effects. This increases equivalent thickness of the gate dielectric layer, reduces gate capacitance and worsens a driving force of the devices. Therefore, work function metals that are suitable for use as the high-k gate dielectric layer are used to replace the conventional poly-silicon gate to be the control electrode.

Also, with the trend in the industry being towards scaling down the size of the metal oxide semiconductor transistors (MOS), three-dimensional or non-planar transistor technology, such as fin field effect transistor technology (FinFET) has been developed to replace planar MOS transistors. Typically, threshold voltage in conventional planar metal gate transistors is adjusted by the means of ion implantation. Nevertheless, threshold voltages in current FinFETs cannot be easily adjusted by using ion implantation. Hence, how to resolve this issue in today's FinFET architecture has become an important task in this field.

SUMMARY OF THE INVENTION

It is one of the primary objectives of the present invention to provide a method of forming a semiconductor device in which a multiple processing steps are carried out, so that, the nitrogen concentrations in barrier layers in each transistor may differ, thereby forming transistors with different threshold voltages.

It is another one of the primary objectives of the present invention to provide a semiconductor device including transistors, in which each transistor may have barrier layers indifferent nitrogen ratio and work function layers in different materials or different thicknesses, so that each transistor may obtain different threshold voltages to achieve better performance.

To achieve the purpose described above, the present invention provides a method of forming a semiconductor device including the following steps. First of all, a substrate is provided. Next, a dielectric layer is formed on the substrate and the dielectric layer includes a first gate trench, a second gate trench and a third gate trench formed therein. Then, a barrier layer is formed on the substrate to fill in the first gate trench, the second gate trench and the third gate trench. Next, a first work function layer is formed on the barrier layer and a second work function layer is formed on the first work function layer. Afterwards, a first processing step is performed on the barrier layer filled in the first gate trench and the second gate trench. Finally, a third work function layer is formed to fill in the first gate trench and the second gate trench and a second processing step is performed on the barrier layer filled in the third gate trench.

To achieve the purpose described above, the present invention provides a semiconductor device including a substrate and a first transistor, a second transistor and a third transistor disposed thereon. The first transistor includes a first channel and a first barrier layer and a first work function layer stacked one over another on the first channel. The second transistor includes a second channel and a second barrier layer and a second work function layer stacked one over another on the second channel. The third transistor includes a third channel and a third barrier layer and a third work function layer stacked one over another on the third channel, wherein the first barrier layer, the second barrier layer and the third barrier layer have different nitrogen concentrations and the first transistor, the second transistor and the third transistor have different threshold voltages respectively.

According to above, the semiconductor device and the method of forming the same in the present invention utilizes forming different patterned photoresist layers to cover various regions, partially removing the work function layers by using such patterned photoresist layers as a mask, and performing different processing steps on the barrier layer under the removed work function layer, to form transistors. In this manner, those transistors with same conductive type may obtain work function layers indifferent thickness or barrier layers in different nitrogen concentrations. Thus, the present invention is able to form N-type or P-type transistors with a high threshold voltage, a low threshold voltage or a standard threshold voltage in the semiconductor device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 are schematic diagrams illustrating a method of forming a semiconductor device according to a first preferred embodiment of the present invention, wherein:

FIG. 1 is a schematic cross-sectional view of a semiconductor device at the beginning of the forming process;

FIG. 2 is a schematic cross-sectional view of a semiconductor device after performing a first processing step;

FIG. 3 is a schematic cross-sectional view of a semiconductor device after performing a second processing step;

FIG. 4 is a schematic cross-sectional view of a semiconductor device after performing a third processing step; and FIG. 5 is a schematic cross-sectional view of a semiconductor device after forming a conductive layer.

DETAILED DESCRIPTION

To provide a better understanding of the present invention, preferred embodiments will be described in detail. The preferred embodiments of the present invention are illustrated in the accompanying drawings with numbered elements.

Figure 1:
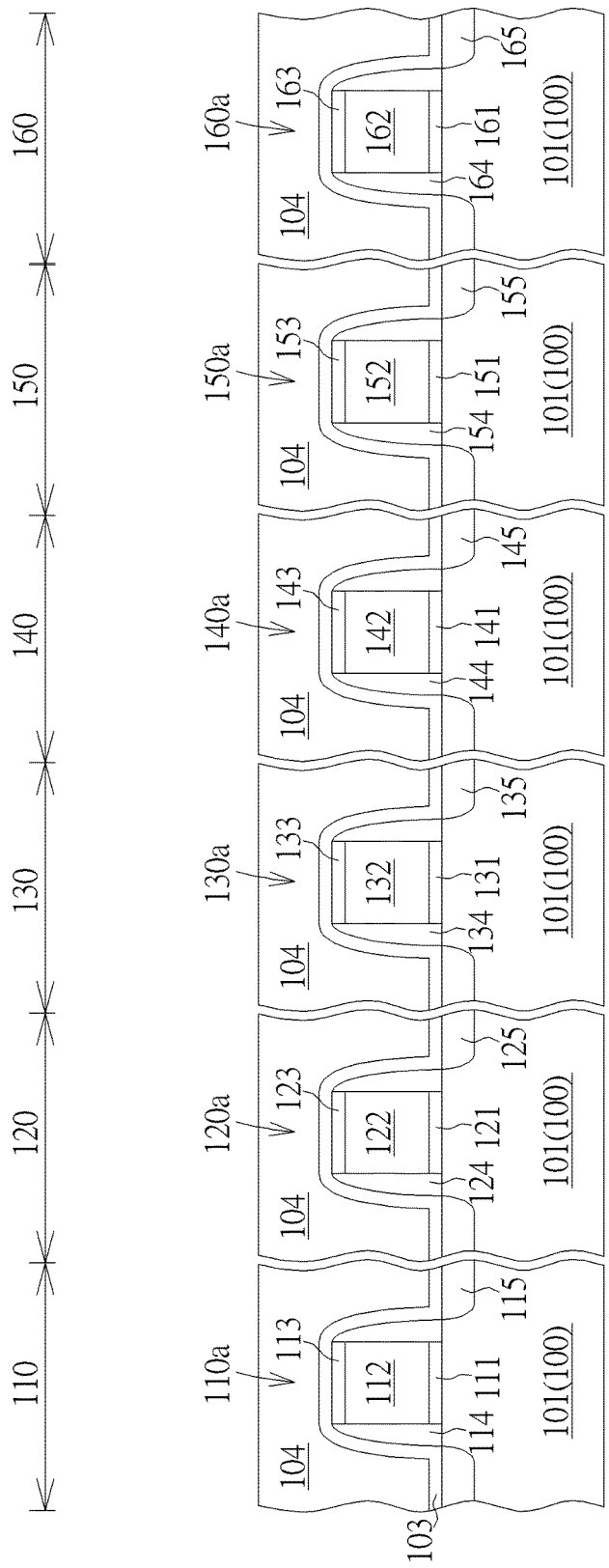

Please refer to FIGS. 1-5 which are schematic diagrams illustrating a method of forming a semiconductor device according to the first preferred embodiment of the present invention. First of all, a substrate 100 is provided as shown in FIG. 1, in which the substrate 100 for example includes a semiconductor substrate such as a silicon substrate, a silicon-containing substrate or a silicon-on-insulator (SOI) substrate, but is not limited thereto. Specifically, six transistor regions 110, 120, 130, 140, 150, 160 are defined on the substrate 100 and which are configured to fabricate transistors with different threshold voltages afterwards. The transistor regions 110, 130, 150 preferably include a first conductive type for example being NMOS regions and the transistor regions 120, 140, 160 preferably include a second conductive type different from the first conductive type for example being PMOS regions. However, in another embodiment of the present invention, the quantity, the conductive type and the arrangement of the transistor regions are not limited to what is shown in FIG. 1 and may be further altered optionally.

Next, at least one fin shaped structure 101 and an insulating layer (not shown in the drawings) may be formed in the substrate 100, wherein a bottom portion of the fin shaped structure 101 is surrounded by the insulating layer such as an oxide layer, and the insulating layer is configured as a shallow trench isolation (STI, not shown in the drawings). In one embodiment, the formation of the fin shaped structure 101 may include firstly forming a patterned mask layer (not shown in the drawings) on the substrate 100 and transferring patterns of the patterned mask to the substrate 100 through an etching process. Then, the patterned mask layer may be completely removed or partially removed due to the structural characteristics of tri-gate transistor device or dual-gate transistor device formed subsequently and the insulating layer is formed through a deposition process, chemical mechanical polishing (CMP) process and an etching back process. Accordingly, a potion of the substrate 100 may protrude from the insulating layer to form the fin shaped structure 101. In another embodiment, the formation of the fin shaped structures 101 may also be accomplished by first forming a patterned hard mask layer (not shown in the drawings) on the substrate 100 and performing an epitaxial process on the exposed substrate 100 through the patterned hard mask layer to form a semiconductor layer (not shown in the drawings) such as a silicon or a silicon germanium layer. The semiconductor layer may then be used as the corresponding fin shaped structure. Alternatively, if an SOI substrate (not shown in the drawings) is provided in one embodiment, the insulating layer may be omitted and a patterned hard mask layer (not shown in the drawings) may also be used to etch a semiconductor layer (not shown in the drawings) on the substrate until reaching a bottom oxide layer (not shown in the drawings) underneath to form the corresponding fin-shaped structure.

Next, a metal gate process is carried out to form six transistor structures on the fin shaped structure 101 (or the substrate 100). In the present embodiment, the formation of the transistor structures is exemplified as a "gate-last" process and a "high-k first" process, but is not limited thereto.

Specifically, six dummy gate structures 110a, 120a, 130a, 140a, 150a, 160a are formed on the substrate 100. In one embodiment, the formation of the dummy gate structures 110a, 120a, 130a, 140a, 150a, 160a may include sequentially forming agate dielectric material layer (not shown in the drawings), a dummy gate material layer (not shown in the drawings) and a capping material layer (not shown in the drawings) stacked one over another on the substrate 100 and patterning those stacked layers to form the dummy gate structures 110a, 120a, 130a, 140a, 150a, 160a. The dummy gate structures 110a, 120a, 130a, 140a, 150a, 160a include gate dielectric layers 111, 121, 131, 141, 151, 161 for example including hafnium oxide ($HfO_2$) or other dielectric material with a dielectric constant greater than 4; dummy gate electrodes 112, 122, 132, 142, 152, 162 for example including doped polysilicon material, undoped polysilicon material or amorphous silicon material; and capping layers 113, 123, 133, 143, 153, 163 having a monolayered structure or a multilayered structure, respectively. Then, spacers 114, 124, 134, 144, 154, 164 for example having a monolayered structure or a multilayered structure are formed on sidewalls of the dummy gate structure 110a, 120a, 130a, 140a, 150a, 160a respectively, in which the spacers 114, 124, 134, 144, 154, 164 may include high temperature oxide (HTO), silicon nitride, silicon oxide, silicon oxynitridd, or silicon nitride formed by hexachlorodisilane ($Si_2Cl_6$) (HCD-SiN). Also, source/drain regions 115, 125, 135, 145, 155, 165 are formed at two sides of the dummy gate structures 110a, 120a, 130a, 140a, 150a, 160a. After that, a contact etch stop layer (CESL) 103 and an interlayer dielectric layer (ILD) 104 such as a silicon oxide layer or a tetraethyl orthosilicate (TEOS) layer may be formed on the substrate 100 to cover the dummy gates structures 110a, 120a, 130a, 140a, 150a, 160a.

Figure 2:
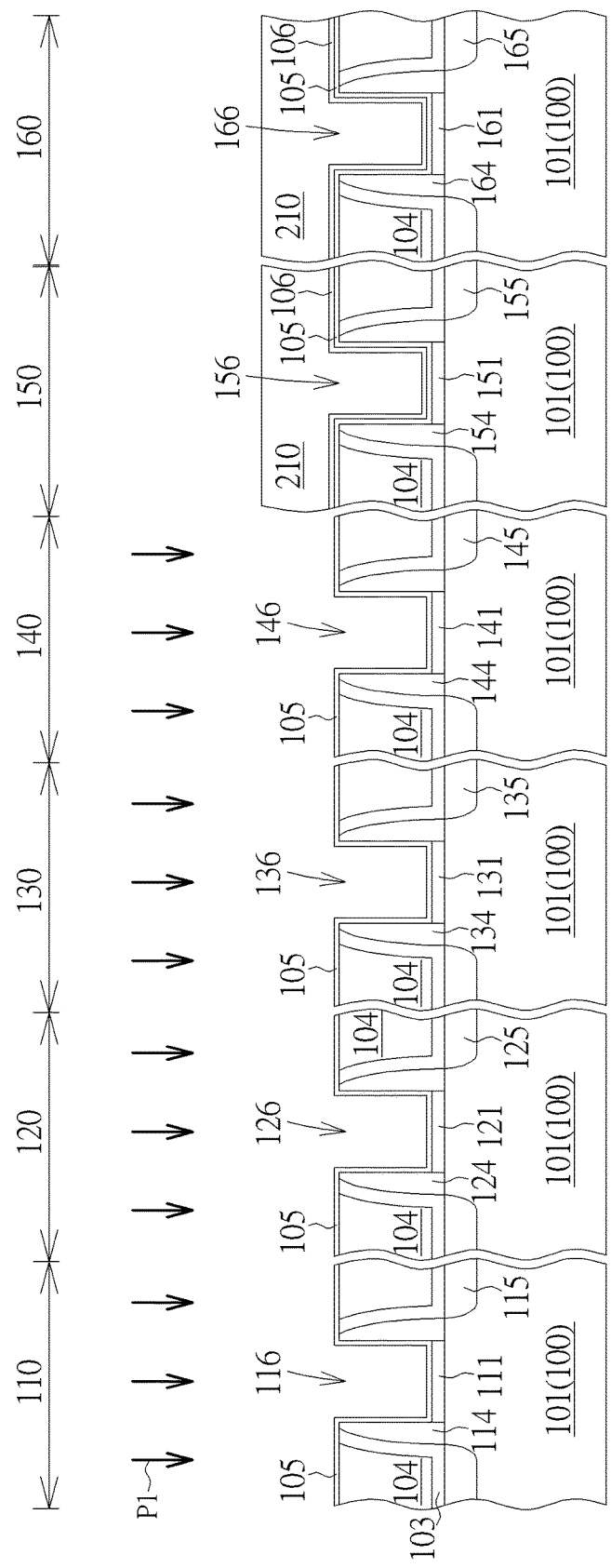

Next, a replacement metal gate (RMG) process is performed and includes performing a planarization process exposing top portions of the dummy gate structures 110a, 120a, 130a, 140a, 150a, 160a and performing an etching process such as a dry etching process or a wet etching process to remove the dummy gate electrodes 112, 122, 132, 142, 152, 162 by using an etchant like ammonium hydroxide ($NH_4OH$) or tetramethylammonium hydroxide (TMAH), thereby forming six gate trenches 116, 126, 136, 146, 156, 166 in the interlayer dielectric layer 104. It is noted that the gate dielectric layers 111, 121, 131, 141, 151, 161 are still remained and disposed at the bottom portions of the gate trenches 116, 126, 136, 146, 156, 166 as shown in FIG. 2.

Next, a bottom barrier layer 105 and a work function layer 106 are sequentially formed, in which the work function layer 106 is formed only in the transistor regions 150, 160 optionally. For example, the detailed formation thereof may include firstly forming a first work function material layer (not shown in the drawings) on the substrate 100 to cover each transistor region 110, 120, 130, 140, 150, 160 and the fin shaped structure 101, forming a patterned mask such as a patterned photoresist layer 210 to cover the transistor regions 150, 160 (namely, to expose the transistor regions 110, 120, 130, 140) and removing the first work function material layer in the transistor regions 110, 120, 130, 140 by using the patterned photoresist layer 210 as a mask, thereby forming the work function layer 106 only disposed in the transistor regions 150, 160 and filled in the gate trenches 156, 166 as shown in FIG. 2. In one embodiment, the removing of the first work function material layer is carried out through an etching process. For example, a second standard clean (SC-2) process is performed by using an etchant including hydrochloric acid (HCl), hydrogen peroxide ($H_2O_2$) and deionized water ($H_2O$) in a 1:1:1 ratio to remove the work function metals in the first work function material layer and to progressively reduce the thickness thereof. The removing of the first work function material layer is performed at a rate of removing about every 10 angstroms in 60 to 90 seconds, preferable to 85 seconds, but is not limited thereto. In another embodiment the bottom barrier layer 105 may include tantalum nitride (TaN); and the work function layer 106 preferably include a P-type work function layer such as including titanium nitride (TiN). In this manner, the bottom barrier layer 105 may additionally function like a protection layer while removing the first work function material layer for avoiding damages to the gate dielectric layers 111, 121, 131, 141.

It is to be noted that in the present embodiment, another etching process such as a processing step P1 is carried out after completely removing the exposed first work function material layer in the transistor regions 110, 120, 130, 140 to tune the nitrogen concentration in the bottom barrier layer 105. In one embodiment, the processing step P1 is performed for example through continuously performing the second standard clean process and using the etchant including hydrochloric acid, hydrogen peroxide and deionized water in a 1:1:1 ratio to react with nitrogen in exposed bottom barrier layer 105. Accordingly, nitrogen of the exposed bottom barrier layer 105 in transistor regions 110, 120, 130, 140 may reduce, for example the ratio between Ta/N and Ta/O therein may reduce to less than 1, such as 0.76. Specifically, the processing step P1 is performed at a slower rate instead of the rate used in removing the first work function material layer to treat surfaces of the bottom barrier layer 105 and to form an interfacial layer (not shown in the drawings) such as a tantalum pentoxide ($Ta_2O_5$) thereon in the transistor regions 110, 120, 130, 140.

Figure 3:
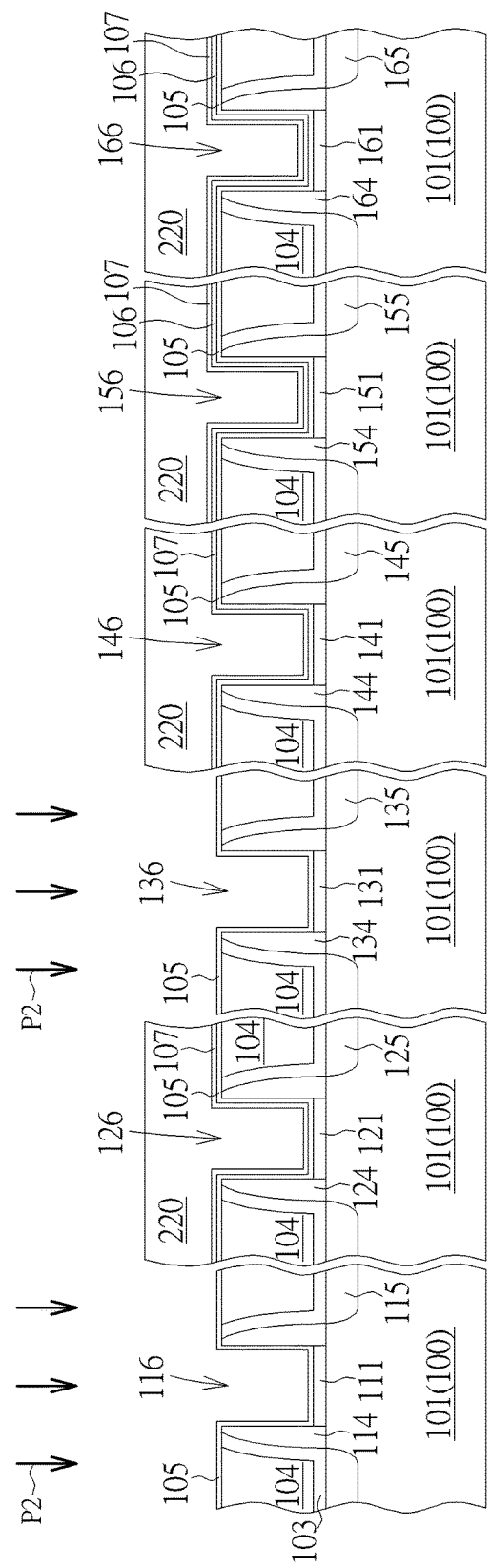

Afterwards, the patterned photoresist layer 210 is removed and a work function layer 107 is formed in the transistor regions 120, 140, 150, 160. For example, the detailed formation thereof may include firstly forming a second work function material layer (not shown in the drawings) on the substrate 100 to cover each transistor region 110, 120, 130, 140, 150, 160 and the fin shaped structure 101, forming a patterned mask such as a patterned photoresist layer 220 to cover the transistor regions 120, 140, 150, 160 (namely, to only expose the transistor regions 110, 130) and removing the second work function material layer in the transistor regions 110, 130 by using the patterned photoresist layer 220 as a mask, thereby forming the work function layer 107 only disposed in the transistor regions 120, 140, 150, 160 and filled in the gate trenches 126, 146, 156, 166 as shown in FIG. 3. In one embodiment, the work function layer 107 preferably includes a P-type work function layer such as including titanium nitride and has a thickness about 10 angstroms, but is not limited thereto.

It is to be noted that the removing processes of the second work function material layer are substantially similar to those in the removing process of the first work function material layer, and will not be redundantly described herein. Also, another etching process such as a processing step P2 is carried out after completing removal of the exposed second work function material layer in the transistor regions 110, 130 to further tune the nitrogen concentration in the bottom barrier layer 105, in transistor regions 110, 130. The processing step P2 may also be performed through continuously performing the second standard clean process and using the etchant including hydrochloric acid, hydrogen peroxide and deionized water in a 1:1:1 ratio to react with nitrogen in exposed bottom barrier layer 105. The detailed conditions and steps are all similar to those described in the processing step P1 and will not be redundantly described herein. In the present embodiment, the processing step P2 is performed to further react with nitrogen in the exposed bottom barrier layer 105 in transistor regions 110, 130, so that, the nitrogen in the exposed bottom barrier layer 105 in transistor regions 110, 130 may be further reduced and the thickness of the formed interfacial layer in transistor regions 110, 130 may be increased. In other words, after the processing step P2, nitrogen in the bottom barrier layer 105 in the transistor regions 110, 130 may be less than nitrogen in the bottom barrier layer 105 in the transistor regions 120, 140; and the interfacial layer formed on the surfaces of bottom barrier layer 105 in the transistor regions 120, 140 may have a greater thickness than the interfacial layer formed on the surfaces of bottom barrier layer 105 in the transistor regions 120, 140.

Figure 4:
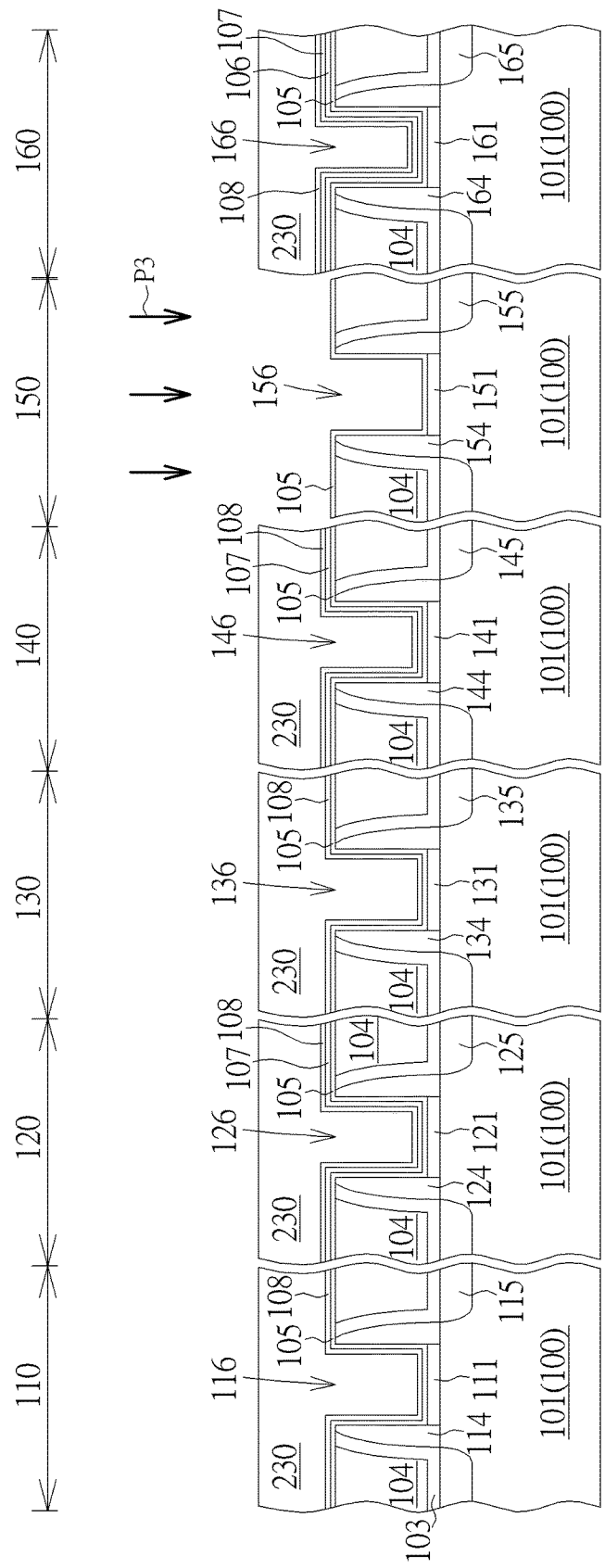

Afterwards, the patterned photoresist layer 220 is removed and a work function layer 108 is formed in the transistor regions 110, 120, 130, 140, 160. For example, the detailed formation thereof may include firstly forming a third work function material layer (not shown in the drawings) on the substrate 100 to cover each transistor region 110, 120, 130, 140, 150, 160 and the fin shaped structure 101, forming a patterned mask such as a patterned photoresist layer 230 to cover the transistor regions 110, 120, 130, 140, 160 (namely, to only expose the transistor region 150) and removing the third work function material layer in the transistor region 150 by using the patterned photoresist layer 230 as a mask, thereby forming the work function layer 108 disposed in the transistor regions 110, 120, 130, 140, 160 and filled in the gate trenches 116, 126, 136, 146, 166 as shown in FIG. 4. In one embodiment, the work function layer 108 preferably includes a P-type work function layer such as including titanium nitride, but is not limited thereto.

It is to be noted that the removing processes of the third work function material layer are substantially similar to those in the removing process of the first work function material layer, and will not be redundantly described herein. Also in the present embodiment, not only the exposed third work function material layer in the transistor region 150, but also the work function layer 107 and the work function layer 106 formed in the transistor region 150 are simultaneously removed as shown in FIG. 4. The removing processes of the work function layers 106, 107 are substantially similar to those in the removing processes of the aforementioned work function material layers and will not be redundantly described herein.

Next, another etching process such as a processing step P3 is carried out after completing removal of the exposed third work function material layer and work function layers in the transistor region 150 to tune the nitrogen concentration in the bottom barrier layer 105, in the transistor region 150. The processing step P3 may also be performed through continuously performing the second standard clean process and using the etchant including hydrochloric acid, hydrogen peroxide and deionized water in a 1:1:1 ratio to react with nitrogen in exposed bottom barrier layer 105. The detailed conditions and steps are all similar to those described in the processing step P1 and will not be redundantly described herein. It is noted that the processing step P3 is performed to react with nitrogen in the exposed bottom barrier layer 105 in transistor region 150 until the nitrogen reduces to less than that in other transistor regions 110, 120, 130, 140, 160. In other words, although only one processing step (referring to processing step P3) is performed, nitrogen in the bottom barrier layer 105 in the transistor region 150 may be acute reacted and consumed in the processing step P3 for example through prolonging the processing time or altering other processing conditions. This makes the bottom barrier layer 105 in the transistor region 150 may obtain the least nitrogen in comparison with that of other transistor regions 110, 120, 130, 140, 160. Also, an interfacial layer (not shown in the drawings) formed on surfaces of the bottom barrier layer 105 in the transistor region 150 may have the greatest thickness among the interfacial layer formed in other transistor regions 110, 120, 130, 140.

Figure 5:
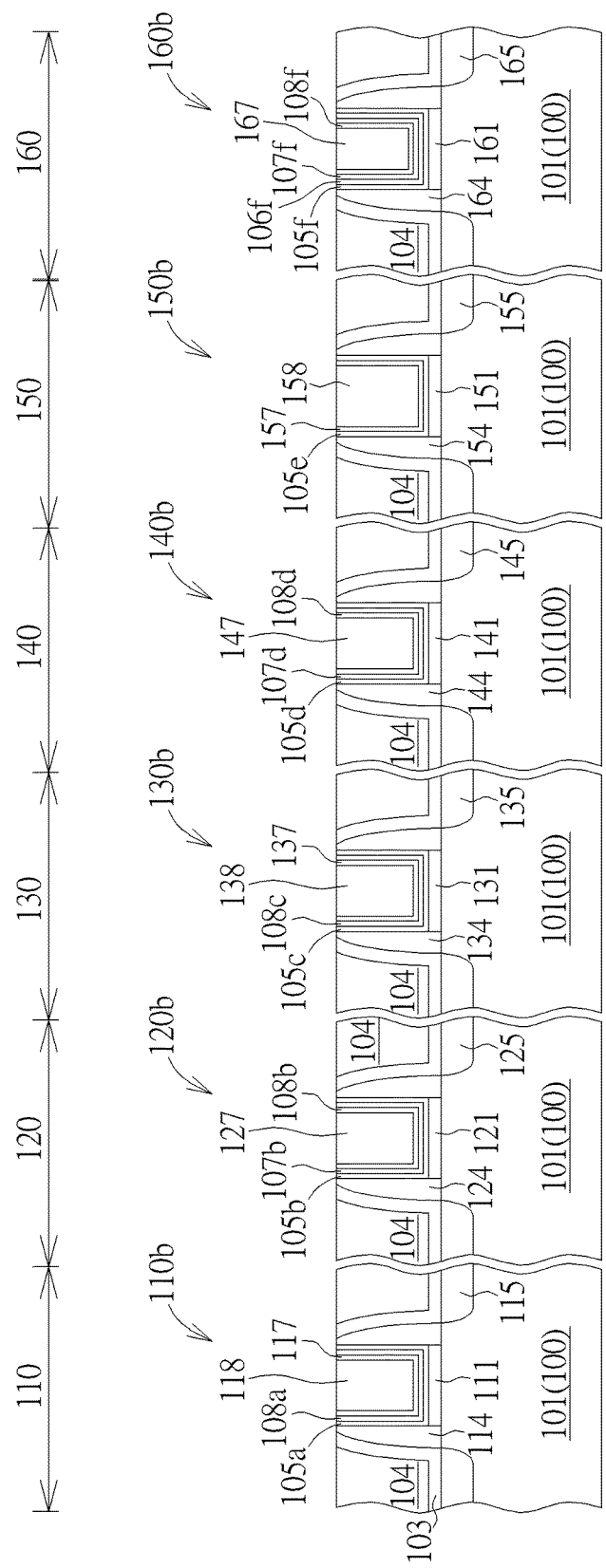

Afterwards, the patterned photoresist layer 230 is removed and a work function material layer (not shown in the drawings) is formed, in which the work function material layer preferably includes a metal material having a work function ranging between 3.9 eV and 4.3 eV such as titanium aluminum carbide (TiAlC), but is not limited thereto. In the present embodiment, the work function material layer only forms in the transistor regions 110, 130, 150 and fills in the gate trenches 116, 136, 156. Then, a top barrier material layer (not shown in the drawings) such as tantalum nitride is formed in the transistor regions 110, 120, 130, 140, 150, 160 to fill in the gate trenches 116, 126, 136, 146, 156, 166, a low resistivity material layer such as aluminum (Al), tungsten (W) or titanium aluminide (TiAl) is formed next to fill up the trenches 116, 126, 136, 146, 156, 166, and a planarization process is performed, thereby forming six transistor structures 110b, 120b, 130b, 140b, 150b, 160b as shown in FIG. 5. However, in another embodiment, the work function material layer, the top barrier material layer and the low resistivity material layer may also be formed entirely on each transistor region 110, 120, 130, 140, 150, 160 to fill in the trenches 116, 126, 136, 146, 156, 166 after the patterned photoresist layer 230 is removed and the planarization process is performed then.

The transistor structure 110b formed in the transistor region 110 includes a bottom barrier layer 105a, a two-layered work function layer (including a work function layer 108a and a work function layer 117 being formed from the work function material layer), a top barrier layer (not shown in the drawings) and a conductive layer 118 stacked one over another on a channel (not shown in the drawings) thereof. The transistor structure 120b formed in the transistor region 120 includes a bottom barrier layer 105b, a two-layered work function layer (including a work function layer 107b and a work function layer 108b), a top barrier layer (not shown in the drawings) and a conductive layer 127 stacked one over another on a channel (not shown in the drawings) thereof. The transistor structure 130b formed in the transistor region 130 includes a bottom barrier layer 105c, a two-layered work function layer (including a work function layer 108c and a work function layer 137 formed from the work function material layer), a top barrier layer (not shown in the drawing) and a conductive layer 138 stacked one over another on a channel (not shown in the drawings) thereof. The transistor structure 140b formed in the transistor region 140 includes a bottom barrier layer 105d, a two-layered work function layer (including a work function layer 107d and a work function layer 108d) a top barrier layer (not shown in the drawings) and a conductive layer 147 stacked one over another on a channel (not shown in the drawings) thereof. The transistor structure 150b formed in the transistor region 150 includes a bottom barrier layer 105e, a monolayered work function layer 157 formed from the work function material layer, a top barrier layer (not shown in the drawings) and a conductive layer 158 stacked one over another on a channel (not shown in the drawings) thereof. The transistor structure 160b formed in the transistor region 160 include a bottom barrier layer 105f, a tri-layered work function layer (including a work function layer 106f, a work function layer 107f and a work function layer 108f), a top barrier layer (not shown in the drawings) and a conductive layer 167 stacked one over another on a channel (not shown in the drawings) thereof. In other words, the transistor structures 110b, 120b, 130b, 140b, 150b, 160b formed in the transistor regions 110, 120, 130, 140, 150, 160 may have various layer of the work function layers respectively, and each work function layer may have the same or different thickness. In this way, the overall thickness of the work function layers in each transistor structure 110b, 120b, 130b, 140b, 150b, 160b may be all diverse.

Furthermore, in the present embodiment, the bottom barrier layer 105 formed in the transistor regions 110, 120, 130, 140, 150, 160 have undergone different processing steps P1-P3. Though these processing steps P1-P3, the bottom barrier layer 105 formed in each transistor regions 110, 120, 130, 140, 150, 160 may obtain different nitrogen ratios (also known as different nitrogen concentration). For example, the bottom barrier layer 105a formed in the transistor region 110 has undergone processing steps P1, P2 and the Ta/N ratio in the bottom barrier layer 105a may be a 1:1.1-1.3 ratio; the bottom barrier layer 105b formed in the transistor region 120 has only undergone the processing step P1 and the Ta/N ratio in the bottom barrier layer 105b may be a 1:1.2-1.4 ratio; the bottom barrier layer 105c formed in the transistor region 130 has undergone the processing steps P1, P2 and the Ta/N ratio in the bottom barrier layer 105b may be a 1:1.1-1.3 ratio; the bottom barrier layer 105d formed in the transistor region 140 has only undergone the processing step P1 and the Ta/N ratio in the bottom barrier layer 105d may be a 1:1.2-1.4 ratio; the bottom barrier layer 105e formed in the transistor region 150 has undergone the processing step P3 to obtain the least nitrogen and the Ta/N ratio in the bottom barrier layer 105e may be a 1:1-1.2 ratio; and the bottom barrier layer 105f formed in the transistor region 160 has not undergone any processing step to obtain the greatest nitrogen and the Ta/N ratio in the bottom barrier layer 105f may be a 1:1.3-1.5 ratio.

Through the aforementioned process, the channels in each transistor structure 110b, 120b, 130b, 140b, 150b, 160b may obtain different threshold voltages. For example, the transistor structures 110b may form an N-type transistor with a high threshold voltage (HVT); the transistor structures 120b may form a P-type transistor with a high threshold voltage; the transistor structure 130b may form an N-type transistor with a standard voltage threshold (SVT); the transistor structure 140b may forma P-type transistor with a standard voltage threshold; the transistor structure 150b may form an N-type transistor with a low threshold voltage (LVT); and the transistor structure 160b may form a P-type transistor with a low threshold voltage, but is not limited thereto.

Thus, the semiconductor device according to the first preferred embodiment of the present invention is obtained. In the present embodiment, a portion of the transistor structures preferably includes the first conductive type such as N-type transistors, and another portion of the transistor structure preferably includes the second conductive type different from the first conductive type such as P-type transistors. In the present invention, different patterned photoresist layers are formed to cover various regions, the work function layers are partially removed by using such patterned photoresist layers as a mask, and then different processing steps are carried out on the barrier layer under the removed work function layer. Through this performance, transistors with the same conductive type may obtain work function layers indifferent thickness or barrier layers in different nitrogen concentrations, and the channels thereof may obtain different threshold voltages accordingly. Then, the present invention is able to form N-type or P-type transistors with a high threshold voltage, a low threshold voltage or a standard threshold voltage in the semiconductor device.

Additionally, it is worth noting that the processing steps of the present invention is performed by using the etchant including hydrochloric acid, hydrogen peroxide and deionized water in a 1:1:1 ratio to react with nitrogen in the barrier layer, so that nitrogen in the bottom barrier layer 105 may be reduced accordingly. In other words, while the processing steps is performed, oxygen may replace with a portion of nitrogen in the barrier layer and the ratio between Ta/N and Ta/O in the barrier layer may reduce to less than 1, such as 0.76. Due to the reduced nitrogen concentration in the barrier layer, the low-resistant metal (such as TiAlC) in the N-type work function layer formed subsequently may easily diffused downwardly. Thus, the transistor with such barrier layer (having reduced nitrogen concentration) may have a low threshold voltage. On the other hand, the N-type transistor with relative thicker work function layer may obtain a high threshold voltage.

However, people who are skilled in the art shall realize the method of forming the semiconductor device in the present invention is not limited to the aforementioned steps, and may also include other processes. For example, in other embodiments, other processes may be performed after partially removing the work function material layers to reduce nitrogen in the bottom barrier layer, or other steps may be performed to further tune the threshold voltages in each transistor region. The following description will detail the different embodiments of the forming method of a semiconductor device in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 6:
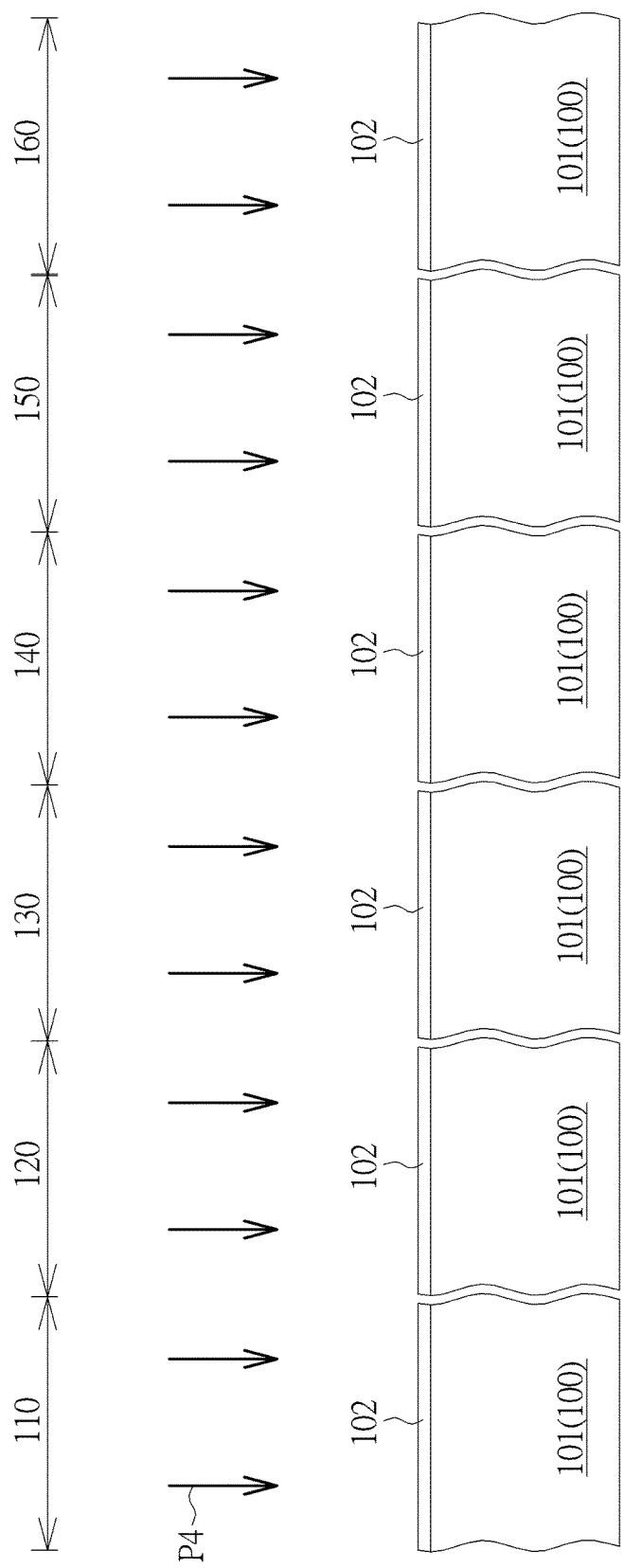
FIG. 6 is a schematic diagram illustrating a method of forming a semiconductor device according to a second preferred embodiment of the present invention.

Please refer to FIG. 6, which is a schematic diagram illustrating a method of forming a semiconductor device according to the second preferred embodiment of the present invention. The differences between the present embodiment and the aforementioned first embodiment are that, before forming the six dummy gate structures 110a, 120a, 130a, 140a, 150a, 160a, at least one threshold voltage implantation process P4 may be firstly performed to implant an anti-type dopant into the transistor regions 110, 120, 130, 140, 150, 160 and to form doped regions 102 in the transistor regions 110, 120, 130, 140, 150, 160 respectively as shown in FIG. 6. For example, if NMOS transistors are required to be formed in the transistor regions 110, 130, 150, a P-type dopant is implanted into the fin shaped structure 101 to primary tune the threshold voltages thereof. On the other hand, if PMOS transistors are required to be formed in the transistor regions 120, 140, 160, an N-type dopant is implanted into the fin shaped structure 101 to primary tune the threshold voltages thereof. In one embodiment, the N-type dopant may include arsenic (As) or phosphorus (P) and the P-type dopant may include boron (B), but is not limited thereto.

Following these, the processes as shown in FIGS. 1-5 of the first preferred embodiment may be subsequently performed to form transistors with different threshold voltages in the transistor regions 110, 120, 130, 140, 150, 160. Also in another embodiment of the present invention, gate dielectric layers in different materials or in different thicknesses may also be formed optionally in each transistor region 110, 120, 130, 140, 150, 160 for further tuning the threshold voltages of the channels thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate;
a first transistor disposed on the substrate, the first transistor comprising:
a first channel; and
a first barrier layer and a first work function layer stacked one over another on the first channel;
a second transistor disposed on the substrate, the second transistor comprising:
a second channel; and
a second barrier layer and a second work function layer stacked one over another on the second channel; and
a third transistor disposed on the substrate, the third transistor comprising:
a third channel; and
a third barrier layer and a third work function layer stacked one over another on the third channel, wherein the first barrier layer, the second barrier layer and the third barrier layer have different nitrogen concentrations and the first transistor, the second transistor and the third transistor have different threshold voltages respectively.

2. The semiconductor device according to claim 1, wherein the first transistor, the second transistor and the third transistor have a same conductive type.

3. The semiconductor device according to claim 1, wherein the first transistor, the second transistor and the third transistor have different conductive types.

4. The semiconductor device according to claim 1, wherein a nitrogen ratio between the first barrier layer, the second barrier layer and the third barrier layer is a 1-1.2:1.1-1.3:1.2-1.5 ratio.

5. The semiconductor device according to claim 1, wherein the first barrier layer, the second barrier layer and the third barrier layer comprise tantalum nitride, and a Ta/N ratio of the first barrier layer is a 1/1-1.2 ratio, a Ta/N ratio of the second barrier layer is a 1/1.1-1.3 ratio and a Ta/N ratio of the third barrier layer is a 1/1.2-1.5 ratio.

6. The semiconductor device according to claim 1, wherein the first work function layer, the second work function layer and the third work function layer have different thicknesses.

7. The semiconductor device according to claim 1, further comprising:
a fourth transistor disposed on the substrate, the fourth transistor comprising:
a fourth channel; and
a fourth barrier layer and a fourth work function layer stacked one over another on the fourth channel, wherein the fourth barrier layer has a nitrogen concentration different from the nitrogen concentrations of the first barrier layer, the second barrier layer and the third barrier layer.

8. The semiconductor device according to claim 7, wherein the fourth transistor has a first conductive type which is different from a second conductive type of the first transistor, the second transistor and the third transistor.

9. The semiconductor device according to claim 7, further comprising:
a fifth transistor disposed on the substrate, the fifth transistor comprising:
a fifth channel; and
a fifth barrier layer and a fifth work function layer stacked one over another on the fifth channel; and
a sixth transistor disposed on the substrate, the sixth transistor comprising:

a sixth channel; and a sixth barrier layer and a sixth work function layer stacked one over another on the sixth channel, wherein the fourth barrier layer, the fifth barrier layer and the sixth barrier layer have different nitrogen concentrations, the nitrogen concentrations of the fourth barrier layer, the fifth barrier layer and the sixth barrier layer are different from the nitrogen concentrations of the first barrier layer, the second barrier layer and the third barrier layer, and the fourth transistor, the fifth transistor and the sixth transistor have different threshold voltages.

10. The semiconductor device according to claim 9, wherein the fourth barrier layer, the fifth barrier layer and the sixth barrier layer comprise tantalum nitride and a Ta/N ratio of the fourth barrier layer is a 1/1.1-1.3 ratio, a Ta/N ratio of the fifth barrier layer is a 1/1.2-1.4 ratio and a Ta/N ratio of the sixth barrier layer is a 1/1.2-1.4 ratio.

11. A method of forming a semiconductor device, comprising:

providing a substrate;

forming a dielectric layer on the substrate, the dielectric layer comprises a first gate trench, a second gate trench and a third gate trench formed therein;

forming a barrier layer on the substrate to fill in the first gate trench, the second gate trench and the third gate trench;

forming a first work function layer on the barrier layer;

forming a second work function layer on the first work function layer;

performing a first processing step on the barrier layer filled in the first gate trench and the second gate trench;

forming a third work function layer to fill in the first gate trench and the second gate trench; and performing a second processing step on the barrier layer filled in the third gate trench.

12. The method of forming a semiconductor device according to claim 11, further comprising:

performing a third processing step on the barrier layer filled in the first gate trench and the second gate trench after the first work function layer is formed.

13. The method of forming a semiconductor device according to claim 12, wherein the first processing step, the second processing step and the third processing step comprise providing hydrochloric acid, hydrogen peroxide and deionized water in a 1:1:1 ratio.

14. The method of forming a semiconductor device according to claim 12, further comprising:

forming an interfacial layer on the barrier layer while the first processing step, the second processing step and the third processing step are performed.

15. The method of forming a semiconductor device according to claim 14, wherein the barrier layer comprises tantalum nitride and the interfacial layer comprises tantalum pentoxide ($Ta_2O_5$).

16. The method of forming a semiconductor device according to claim 12, further comprising:

forming a first work function material layer on the barrier layer to fill in the first gate trench, the second gate trench and the third gate trench; and before performing the third processing step, removing the first work function material layer filled in the first gate trench and the second gate trench to form the first work function layer and to expose the barrier layer filled in the first gate trench and the second gate trench.

17. The method of forming a semiconductor device according to claim 16, further comprising:

forming a second work function material layer on the first work function layer to fill in the first gate trench, the second gate trench and the third gate trench; and before performing the first processing step, removing the second work function material layer filled in the first gate trench to form the second work function layer and to expose the barrier layer filled in the first gate trench.

18. The method of forming a semiconductor device according to claim 17, further comprising:

forming a third work function material layer on the second work function layer to fill in the first gate trench, the second gate trench and the third gate trench; and before performing the second processing step, removing the third work function material layer, the second work function layer and the first work function layer filled in the third gate trench to form the third work function layer and to expose the barrier layer filled in the third gate trench.

* * * * *